Sept. 22, 1970 R. P. FOERSTER 3,530,314

MONOSTABLE MULTIVIBRATOR CIRCUIT INCLUDING MEANS
FOR PREVENTING VARIATIONS IN OUTPUT PULSE WIDTH

Filed Nov. 3, 1966

ROY P. FOERSTER
INVENTOR.

1

3,530,314

MONOSTABLE MULTIVIBRATOR CIRCUIT INCLUDING MEANS FOR PREVENTING VARIATIONS IN OUTPUT PULSE WIDTH

Roy P. Foerster, Thousand Oaks, Calif., assignor to The Bunker-Ramo Corporation, Canoga Park, Calif., a corporation of Delaware Filed Nov. 3, 1966, Ser. No. 591,886
Int. Cl. H03k 3/10
U.S. Cl. 307—273 5 Claims

ABSTRACT OF THE DISCLOSURE

A monostable multivibrator circuit including means for preventing variations in output pulse width which could otherwise be caused by an input trigger pulse occurring prior to the complete recharging of the multivibrator timing capacitor. The circuit includes a locking transistor responsive to the flow of capacitor charging current for preventing conduction in the circuit output transistor.

This invention relates to monostable multivibrator circuits and, more particularly, to a monostable multivibrator circuit that cannot be re-triggered until it has fully recovered from its previous cycle of operation.

Monostable or "single-shot" multivibrators are well known in the art and are used extensively in present day computers. Such multivibrators serve to provide an output pulse of predetermined width in response to an input trigger pulse, the width of the output pulse being independent of the width of the input trigger pulse and being dependent only upon various circuit constants of the multivibrator.

Many such circuits presently used suffer from a deficiency in that they can be re-triggered by an input pulse before they have completely recovered from a previous cycle of operation. Thus, they may provide output puses of varying width, which is extremely undesirable and deleterious in many computer applications.

Generally, monostable multivibrators comprise two unidirectionally conductive devices such as transistors, the input transistor being normally fully conducting (saturated) and the output transistor normally being cut off. A feedback circuit connects one transistor to the other, so that when a trigger pulse is applied to the normally conducting transistor to cut it off, the normally nonconducting transistor is rendered conductive. The feedback circuit generally includes an energy storage device such as a capacitor, which is charged while the normally conducting transistor is conducting and which is discharged while the normally conducting transistor is cut off. The discharge time of the capacitor determines the length of time that the normally nonconducting transistor is conducting, and hence determines the width of the output pulse. If, however, an input trigger pulse is received before the capacitor is completely recharged and it is again caused to discharge, its discharge time will be less than were it completely recharged, and the width of the output pulse will correspondingly be less than it would be were the capacitor completely recharged. This possibility of variable output pulse width is naturally undesirable.

2

The foregoing disadvantage is obviated in the present invention by providing a "locking" transistor which prevents the normally cut off output transistor from being turned on until the capacitor has fully recharged after a cycle of operation. Even though trigger pulses are passed to the circuit, no multivibrator action will take place until the capacitor is fully charged and the "locking" transistor is turned off. Thus, the cycle of operation and its timing is independent of the input trigger pulse repetition rate.

The invention, together with further features and advantages thereof, will be better understood from the following description taken in conjunction with the accompanying drawing, in which.

Figure 1:
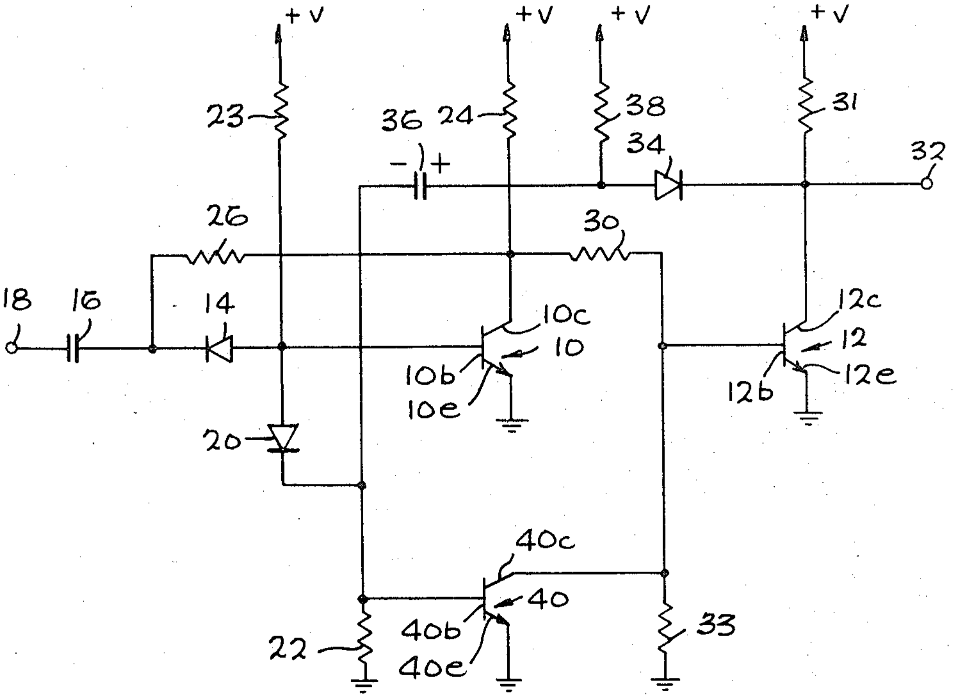
FIG. 1 is a circuit diagram of a preferred embodiment of the invention.

Attention is now called to FIG. 1 which shows a monostable multivibrator in accordance with the invention which includes two unidirectionally conductive devices, such as NPN transistors 10 and 12, connected in a conventional configuration. The transistor 10 has a base 10*b*, which is connected through diode 14 and a capacitor 16 to an input terminal 18, and through a diode 20 and a resistor 22 to ground. The juncture of the anodes of the diodes 14 and 20 is connected through a resistor 23 to a positive source of bias voltage +V (not shown). The collector 10*c* of the transistor 10 is connected to the voltage source +V through a resistor 24 and to the juncture of the capacitor 16 and the diode 14 through a resistor 26. The emitter 10*e* of the transistor 10 is grounded.

The base 12*b* of the transistor 12, which can be considered as an output switch, is connected through a resistor 30 to the collector 10*c* of the transistor 10, and through a resistor 33 to ground. The emitter 12*e* of the transistor 12 is grounded. The collector 12*c* of the transistor 12 is connected to the source of positive voltage +V through a resistor 31 and to an output terminal 32. The collector 12*c* is also connected in a feedback circuit through a diode 34 and an energy storage device, such as a capacitor 36, to the cathode of the diode 20. The capacitor 36 serves as one of the elements that control the width of the output pulse from the circuit. Both the anode and cathode of the diode 34 are connected to the source of +V, the anode being connected through a resistor 38 and the cathode being connected through the resistor 31. The circuit described thus far is a conventional monostable or single-shot multivibrator.

In the normal or quiescent state of the circuit, the transistor 10 is fully conducting (saturated), because its base 10*b* is positive with respect to its emitter 10*e* due to the voltage drop across the diode 20 and the resistor 22. Thus, the collector 10*c* of the transistor 10 is essentially grounded, which maintains the base 12*b* of the transistor 12 at ground potential and that transistor cut off. While the transistor 10 is so conducting, the capacitor 36 charges through the resistors 38 and 22 to the value of the voltage source +V. The signal appearing at the output terminal 32 equals the voltage level of the source +V (neglecting voltage drop due to leakage current through the transistor 12).

When a negative-going trigger signal is applied to the input terminal 18, it drives the base 10*b* and the collector 10*c* of the transistor 10 negative, which starts to turn off that transistor. As conduction through the transistor 10 decreases, the potential of the collector 10*c* increases, which increase in potential is transferred to the base 12*b* of the output transistor switch 12. As the potential on the base 12*b* rises above the potential of the emitter 12*e* (ground potential), the transistor 12 starts to conduct, and the potential at the output terminal 32 falls essentially to ground level. The capacitor 36 then starts to discharge through the resistor 23 and the transistor 12, and in a length of time, depending on the time constant of the circuit comprising the resistors 23 and 38 and the capacitor 36, discharges completely. At that time, the transistor 10 starts to turn on again, which generally causes the transistor 12 to start to turn off. The regenerative action continues until the transistor 10 is fully conducting and the transistor 12 is nonconducting. At that point in time, the capacitor 36 starts to recharge.

The difficulty experienced with such circuits as thus far described is that it is possible that the circuit may be re-triggered before the capacitor 36 is entirely recharged. Inasmuch as the width of the output pulse appearing on the terminal 32 depends on the length of time that it takes the capacitor 36 to discharge, and that length of time is directly dependent on the charge on the capacitor, not fully recharging the capacitor 36 can cause the output pulse width to vary. This, of course, is extremely undesirable in a computer application where the output pulse appearing on the terminal 32 is being used to gate other circuits that perform computational operations.

In the present invention, variation in output pulse width is prevented by maintaining the transistor 12 in a cut off condition until the capacitor 36 is fully recharged. Thus, even though trigger pulses are applied to the input terminal 18, the transistor 12 cannot be turned on until the capacitor 36 has recharged. This results in the output pulses appearing at the terminal 32 being of uniform width, regardless of the input pulse trigger rate.

The foregoing is accomplished by providing "locking" means, in this case, an NPN transistor 40, having a base 40*b*, a collector 40*c*, and an emitter 40*e*. The base 40*b* is connected to the ungrounded side of the resistor 22, the collector 40*c* is connected to the base 12*b* of the transistor 12, and the emitter 40*e* is grounded.

In operation, while the capacitor 36 is charging, current flows through the resistor 38, the capacitor 36 and the resistor 22 in one path, and through the resistor 23, diode 20, and resistor 22 in another path. Thus, the voltage drop across the resistor 22 maintains the base 40*b* of the transistor 40 above ground level, and maintains the transistor 40 conducting, inasmuch as its base 40*b* is positive with respect to its emitter 40*e*. When the transistor 40 is conducting, its collector 40*c* is essentially at ground potential, which maintains the base 12*b* of the transistor 12 at that potential. Hence, the transistor 12 is maintained in a cut off condition. When the capacitor 36 is fully charged, current flow through the resistor 22 is reduced, and current flow through the transistor 40 is cut off. This removes control of transistor 12 from transistor 40 and permits transistor 10 to thereafter control transistor 12. Thus, the circuit is ready for the receipt of the next input trigger pulse.

Figure 2:
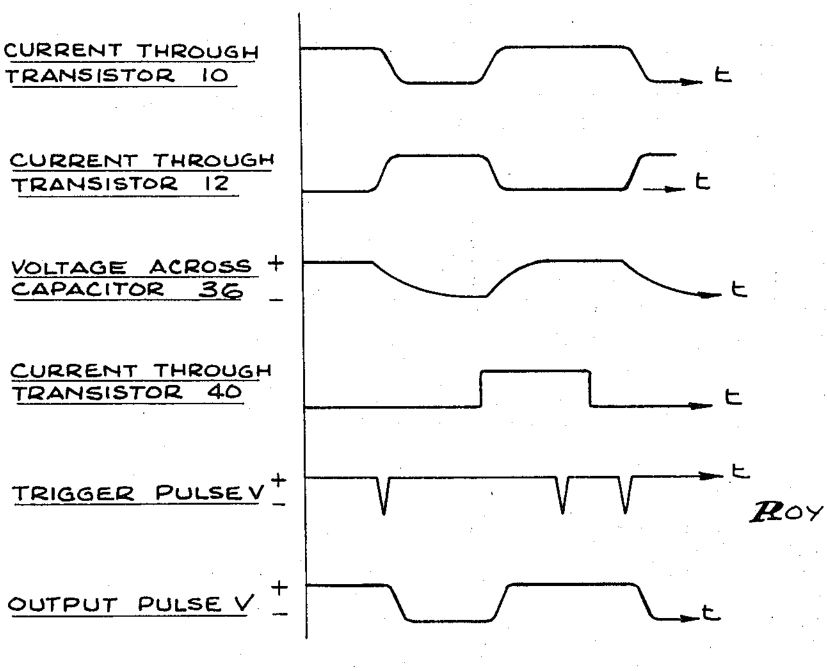
FIG. 2 shows various idealized waveforms useful in understanding the invention.

FIG. 2 shows idealized waveforms that could be found at various points in the circuit. These include waveforms illustrating current flow through the three transistors 10, 12 and 40, and waveforms representing the voltages present across the capacitor 36, the input trigger voltage pulse and the output voltage pulse. It is seen that the input trigger pulse occurring while the transistor 40 is conducting, and before the capacitor 36 has been fully recharged, has no effect and no negative-going output is produced. Thus, the transistor 40 effectively serves as a locking means to prevent re-triggering of the monostable multivibrator circuit of the invention before the pulse-width determining capacitor has fully recharged and prevents variable-width output pulses that could well cause computer malfunction.

It is apparent that, although NPN transistors have been shown and described in the circuit, other types of transistors or unidirectionally conductive devices could be used equally well merely by changing circuit constants and/or voltage polarities, a procedure well known to those skilled in the art. Furthermore, various other changes and modifications may be made by one skilled in the art, without departing from the spirit and scope of the invention.

The embodiments of the invention in which an exclusive property or privilege is claimed are defined as follows:

1. A monostable multivibrator comprising:
first and second transistors, each having a base, a collector and an emitter, said first transistor being normally conductive and said second transistor being normally nonconductive;
means for coupling an input trigger signal to said base of said first transistor for rendering said first transistor nonconductive;
means connecting said collector of said first transistor to said base of said second transistor, whereby said second transistor is rendered conductive when said first transistor becomes nonconductive;
an output terminal connected to said collector of said second transistor;
means grounding said emitters of both said first and second transistors;
a capacitor connected between said collector of said second transistor and said base of said first transistor to charge when said first transistor is conductive and to discharge through said second transistor when said second transistor is conductive; and
locking means for preventing conduction in said second transistor until said capacitor has substantially completely recharged, said locking means including a third transistor connected between said first and second transistors.

2. The multivibrator defined by claim 1 wherein said third transistor has a base, a collector and an emitter, and said base is connected to a charging circuit for said capacitor, said collector is connected to said second transistor base and said emitter is grounded.

3. A monostable multivibrator comprising:
first and second transistors;
means interconnecting said first and second transistors for off-biasing said second transistor when said first transistor is forward biased and for forward biasing said second transistor when said first transistor is off-biased;
means normally forward biasing said first transistor;
means responsive to an input signal for off-biasing said first transistor;
a capacitor;
means for supplying a current in a first direction to said capacitor when said second transistor is off-biased;
means for supplying a current in a second direction, opposite to said first direction, to said capacitor when second transistor is forward biased;
impedance means connected in series with said capacitor for conducting said current supplied to said
a third transistor having a base, an emitter, and a
capacitor in said second direction;
collector;
means connecting said impedance means to said base of said third transistor for forward biasing said third transistor in response to current through said impedance means; and
means connecting said third transistor to said second transistor for off-biasing said second transistor when said third transistor is forward biased.

4. The multivibrator of claim 3 wherein said second transistor has a base, an emitter, and a collector; and wherein said means connecting said third transistor to said second transistor includes means connecting said third transistor collector to said second transistor base.

5. The multivibrator of claim 3 wherein said second transistor has a base, an emitter, and a collector; and unidirectional current conducting means connecting said capacitor in series with the collector-emitter path of said second transistor.

References Cited

UNITED STATES PATENTS

| | | | |
|---|---|---|---|
| 3,171,978 | 3/1965 | Weber | 307—273 X |
| 3,260,857 | 7/1966 | Weber | 307—273 X |
| 3,278,756 | 10/1966 | Weber | 307—273 X |
| 3,382,375 | 5/1968 | Discert | 307—273 |

DONALD D. FORRER, Primary Examiner

J. D. FREW, Assistant Examiner

U.S. Cl. X.R.

307—237, 294; 328—207